(12) United States Patent
Nagatake et al.

(10) Patent No.: US 8,344,414 B2
(45) Date of Patent: Jan. 1, 2013

(54) SEMICONDUCTOR LIGHT EMITTING DEVICE

(75) Inventors: Tsuyoshi Nagatake, Kanagawa (JP); Jugo Mitomo, Fukushima (JP)

(73) Assignee: Sony Corporation, Tokyo (JP)

( * ) Notice: Subject to any disclaimer, the term of this patent is extended or adjusted under 35 U.S.C. 154(b) by 182 days.

(21) Appl. No.: 12/805,086

(22) Filed: Jul. 12, 2010

(65) Prior Publication Data

US 2011/0031528 A1    Feb. 10, 2011

(30) Foreign Application Priority Data

Aug. 7, 2009  (JP) ................................. 2009-184673

(51) Int. Cl.
*H01L 33/00* (2010.01)
(52) U.S. Cl. ................................ 257/103; 257/E33.027
(58) Field of Classification Search .................. 257/103, 257/E33.013, E33.014, E33.016, E33.026, 257/E33.027; 438/46
See application file for complete search history.

(56) References Cited

U.S. PATENT DOCUMENTS 6,399,965 B2   6/2002 Nakamura et al.
6,417,522 B1 * 7/2002 Wang et al. ..................... 257/79

FOREIGN PATENT DOCUMENTS

JP    2001-267631    9/2001

* cited by examiner

*Primary Examiner* — Julio J Maldonado
*Assistant Examiner* — Daniel Shook
(74) *Attorney, Agent, or Firm* — Rader Fishman & Grauer, PLLC

(57) ABSTRACT

A semiconductor light emitting device with which a driving voltage is able to be kept low is provided. The semiconductor light emitting device includes: an n-type cladding layer; an active layer; a p-type cladding layer containing AlGaInP; an intermediate layer; and a contact layer containing GaP in this order, wherein the intermediate layer contains $Ga_{1-a}In_aP$ ($0.357 \leq a \leq 0.408$), and has a thickness of from 10 nm to 20 nm both inclusive.

4 Claims, 5 Drawing Sheets

SEMICONDUCTOR LIGHT EMITTING DEVICE

BACKGROUND OF THE INVENTION

1. Field of the Invention

The present invention relates to a semiconductor light emitting device having an intermediate layer between a p-type cladding layer and a contact layer.

2. Description of the Related Art

In the past, as a semiconductor light emitting device such as a light emitting diode (LED) that emits light in green to red waveband, AlGaInP semiconductor light emitting devices have been known. Such an AlGaInP semiconductor light emitting device includes, for example, an n-type cladding layer, an active layer, a p-type cladding layer, and a contact layer in this order over a GaAs substrate.

However, in the AlGaInP semiconductor light emitting device, for example, voltage drop is large in a hetero junction between the p-type cladding layer containing AlGaInP and a contact layer containing GaP, and accordingly a voltage for driving the device (driving voltage) is easily increased. Further, lattice defect and a crosshatch structure are easily generated due to lattice mismatching in such a junction. In result, the driving voltage is increased, the device is easily deteriorated, leading to lowered reliability.

Thus, in the AlGaInP semiconductor light emitting device, a technology for providing an intermediate layer containing AlGaInP or GaInP between the p-type cladding layer and the contact layer to resolve the foregoing disadvantages has been known (for example, Japanese Unexamined Patent Application Publication No. 2001-267631). Specifically, the intermediate layer composed of p-type AlGaInP or GaInP is provided so that the lattice matching ratio $\Delta a/a$ to the GaAs substrate becomes, for example, $-2.5\%$.

SUMMARY OF THE INVENTION

However, in the foregoing Japanese Unexamined Patent Application Publication No. 2001-267631, the indium composition ratio of AlGaInP or GaInP composing the intermediate layer is set to a significantly small value. Thus, it may be difficult to sufficiently inhibit generation of lattice defect and cross hatch due to lattice mismatching with the GaAs substrate. Thus, in the case where the intermediate layer is provided, it is necessary to set a large indium composition ratio of the intermediate layer for inhibiting generation of lattice defect or the like. However, in the case where the indium composition ratio becomes large, bandgap of the intermediate layer becomes narrow (small), light emitted from an active layer is absorbed, and light emitting output is decreased. Accordingly, a semiconductor light emitting device with a low driving voltage, a high light emitting output, and high reliability has been aspired.

In view of the foregoing disadvantage, in the invention, it is desirable to provide a semiconductor light emitting device with which the driving voltage is kept low, and the light emitting output and the reliability are able to be improved.

According to an embodiment of the invention, there is provided a first semiconductor light emitting device including an n-type cladding layer, an active layer, a p-type cladding layer containing AlGaInP, an intermediate layer, and a contact layer containing GaP in this order. The intermediate layer contains $Ga_{1-a}In_aP$ ($0.357 \leq a \leq 0.408$), and has a thickness of from 10 nm to 20 nm both inclusive.

According to an embodiment of the invention, there is provided a second semiconductor light emitting device including an n-type cladding layer, an active layer, a p-type cladding layer containing AlGaInP, an intermediate layer, and a contact layer containing GaP in this order. The intermediate layer has a superlattice structure including a first semiconductor layer containing $Ga_{1-b}In_bP$ ($0.357 \leq b \leq 0.408$) and a second semiconductor layer containing $(Al_cGa_{1-c})_{1-d}In_dP$ ($0.4 \leq c \leq 1, 0 \leq d \leq 1$). The total thickness of the first semiconductor layer in the superlattice structure is from 10 nm to 20 nm both inclusive.

In the first semiconductor light emitting device of the embodiment of the invention, the intermediate layer that contains $Ga_{1-a}In_aP$ and has a thickness of from 10 nm to 20 nm both inclusive is provided between the p-type cladding layer containing AlGaInP and the contact layer containing GaP. Thereby, voltage drop between the p-type cladding layer and the contact layer is inhibited, and lattice matching in the intermediate layer becomes favorable. Thus, lattice defect and crosshatch structure are hardly generated, and in result, the device is hardly deteriorated. In addition, the bandgap of the intermediate layer is sufficiently secured, and thus absorption of the light emitted from the active layer is inhibited.

In the second semiconductor light emitting device of the embodiment of the invention, the intermediate layer between the p-type cladding layer and the contact layer has the foregoing superlattice structure including the first semiconductor layer containing $Ga_{1-b}In_bP$ and the second semiconductor layer containing $(Al_cGa_{1-c})_{1-d}In_dP$. The first semiconductor layer included in the intermediate layer contains $Ga_{1-b}In_bP$ having the same composition as the foregoing $Ga_{1-a}In_aP$, and has a given total thickness. Thus, voltage drop between the p-type cladding layer and the contact layer is inhibited, and deterioration of the device and absorption of light emitted from the active layer are inhibited. Further, since the intermediate layer has the super lattice structure including the first semiconductor layer and the second semiconductor layer, the effective bandgap in the intermediate layer is more broadened. Accordingly, absorption of the light emitted from the active layer is more inhibited.

In the first semiconductor light emitting device and the second semiconductor light emitting device of the embodiments of the invention, the intermediate layer provided between the p-type cladding layer and the contact layer contains the foregoing $Ga_{1-a}In_aP$ and has a given thickness, or has the first semiconductor layer containing $Ga_{1-b}In_bP$ having a given total thickness. Thereby, voltage drop is kept low, and light emitting output and reliability are able to be improved. In particular, according to the second semiconductor light emitting device of the embodiment of the invention, the intermediate layer has the foregoing super lattice structure including the first semiconductor layer and the second semiconductor layer. Accordingly, the light emitting output is able to be more improved.

Other and further objects, features and advantages of the invention will appear more fully from the following description.

DETAILED DESCRIPTION OF THE PREFERRED EMBODIMENTS

Embodiments of the invention will be hereinafter described in detail with reference to the drawings. The description will be given in the following order:
1. First embodiment (example of a semiconductor light emitting device having an intermediate layer between a p-type cladding layer and a p-side contact layer)
2. Modified example (example of other intermediate layer)
3. Second embodiment (example of other semiconductor light emitting device)

1. First Embodiment

Figure 1:
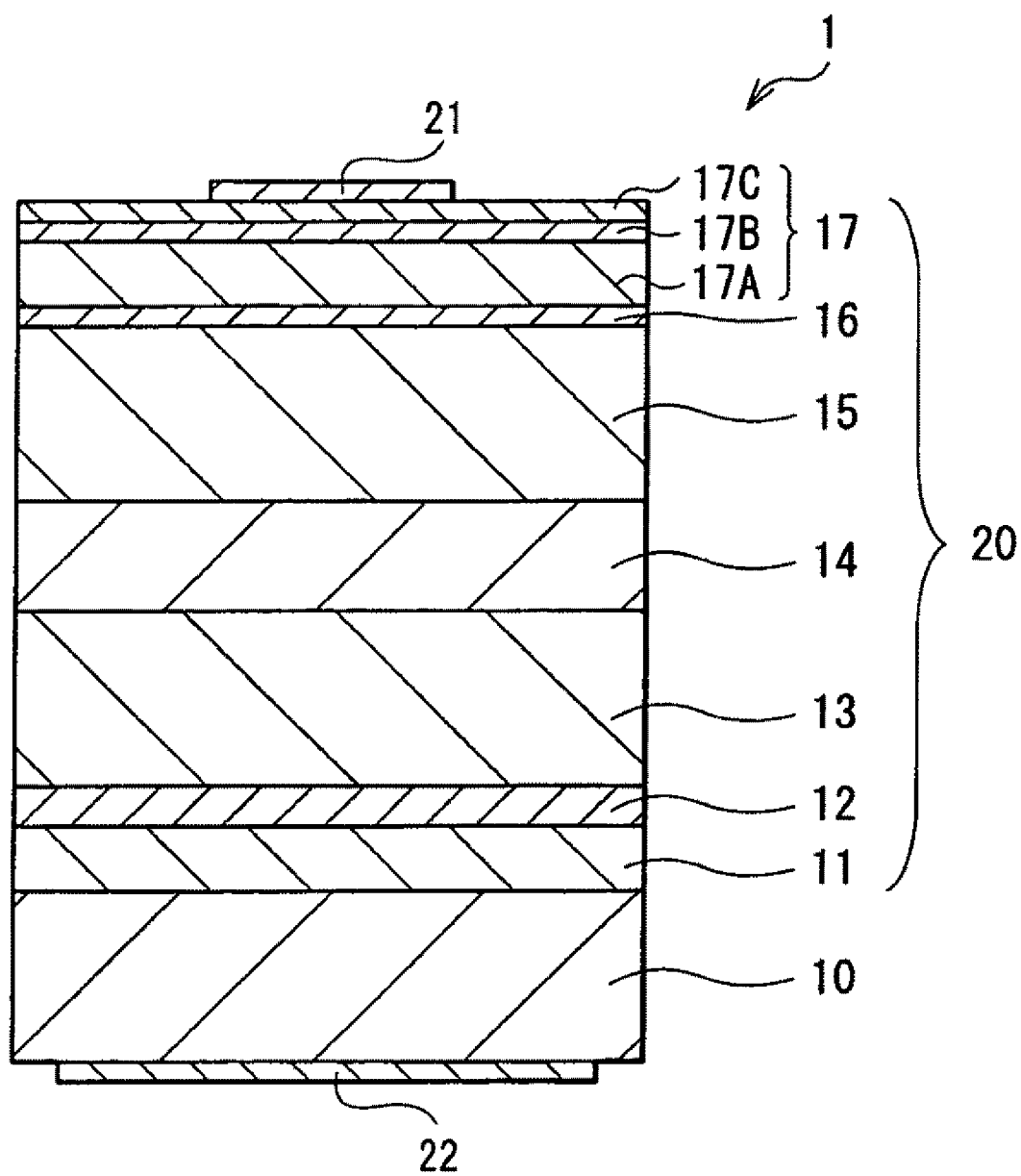
FIG. 1 is a schematic view illustrating a cross sectional structure of a semiconductor light emitting device according to a first embodiment of the invention.
Figure 2:
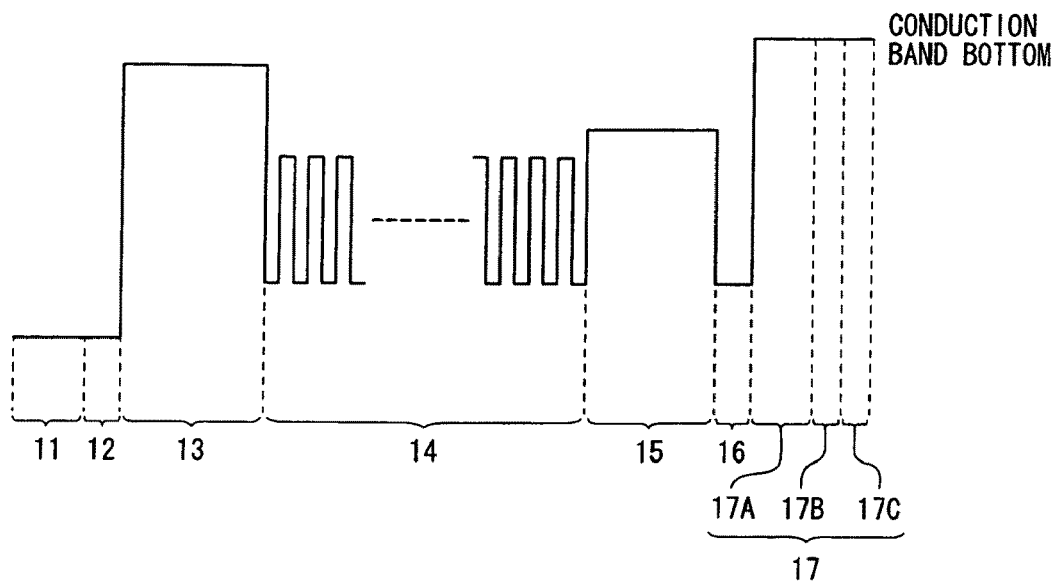
FIG. 2 is a schematic view illustrating each energy band in each layer of the laminated structure illustrated in FIG. 1.

FIG. 1 schematically illustrates a cross sectional structure of a semiconductor light emitting device according to a first embodiment of the invention. FIG. 2 schematically illustrates a level of conduction band bottom of each energy band in each layer structuring a laminated structure 20 illustrated in FIG. 1. A semiconductor light emitting device 1 in this embodiment includes the laminated structure 20 having an active layer 14 on a substrate 10. A p-side electrode 21 is provided on the laminated structure 20, and an n-side electrode 22 is provided on the rear face side of the substrate 10. In the semiconductor light emitting device 1, light is emitted from the active layer 14. The semiconductor light emitting device 1 is used, for example, as a light emitting diode.

The laminated structure 20 has a buffer layer 11, an n-side contact layer 12, an n-type cladding layer 13, the active layer 14, a p-type cladding layer 15, an intermediate layer 16, and a p-side contact layer 17 sequentially from the substrate 10 side. In the laminated structure 20, each layer except for the buffer layer 11 and the n-side contact layer 12 is respectively composed of AlGaInP (aluminum gallium indium phosphorus) semiconductor. AlGaInP semiconductor means a compound semiconductor containing an element selected from the group consisting of aluminum (Al), gallium (Ga), and indium (In) as a Group 13 element of long period periodic table and phosphorus (P) as a Group 15 element of long period periodic table.

The substrate 10 is used as a crystal growth-use substrate, and a gallium arsenic (GaAs) substrate or the like. In this case, the substrate 10 is a GaAs substrate.

The buffer layer 11 is formed on the front face of the substrate 10 in order to obtain favorable crystal growth of the respective semiconductor layers from the n-side contact layer 12 to the p-side contact layer 17. The buffer layer 11 is, for example, formed from GaAs containing n-type impurity (n-type dopant). Examples of the n-type dopant include Se. The concentration of the n-type dopant (doping concentration) in the buffer layer 11 is, for example, $5*10^{18}$ cm$^{-3}$. The thickness of the buffer layer 11 is, for example, 200 nm. Further, though the buffer layer 11 has a single layer structure in FIG. 1 and FIG. 2, the buffer layer 11 may have a two layer structure. In this case, for example, the buffer layer 11 has an Se doped n-type GaAs layer and an Se doped n-type GaInP layer sequentially from the substrate 10 side. In this case, the thickness of the n-type GaAs layer is, for example, 200 nm, and the Se doping concentration is, for example, $5*10^{18}$ cm$^{-3}$. Further, in the n-type GaInP layer, for example, $Ga_{0.506}In_{0.494}P$ is contained, the thickness is 200 nm, and the Se doping concentration is $2*10^{18}$ cm$^{-3}$. The lattice matching ratio $\Delta a/a$ of the n-type GaInP layer formed as above to the substrate 10 becomes 0.075%. The component material of the buffer layer 11 is not limited to the foregoing material, but other component may be contained in the buffer layer 11. The same is applied to the after-mentioned respective layers.

The n-side contact layer 12 is, for example, formed from GaAs containing n-type dopant. The concentration of the n-type dopant in the n-side contact layer 12 is, for example, $2*10^{18}$ cm$^{-3}$. The thickness of the n-side contact layer 12 is, for example, 100 nm.

In the n-type cladding layer 13, the bandgap thereof is larger than the bandgap of the active layer 14, and the refractive index thereof is smaller than the refractive index of the active layer 14. The n-type cladding layer 13 contains n-type dopant, and is formed from, for example, n-type $(Al_{x1}Ga_{1-x1})_{1-x2}In_{x2}P$ ($0<x1\leq1$, $0<x2\leq1$). In the n-type cladding layer 13, the conduction band bottom thereof is higher than the conduction band bottom of the active layer 14. Examples of the n-type cladding layer 13 include an n-type $Al_{0.506}In_{0.494}P$ layer having a thickness of 900 nm that is doped with Se at the concentration of $5*10^{18}$ cm$^{-3}$. In this case, the lattice matching ratio $\Delta a/a$ of the n-type cladding layer 13 to the substrate 10 becomes, for example, 0.075%.

The active layer 14 has a bandgap corresponding to a given light emitting wavelength (for example, red band), and, for example, includes a light emitting region in the central region thereof. The active layer 14 includes, for example, a multiple quantum well structure in which a quantum well layer and a barrier layer are alternately layered. For example, a plurality of pairs of the quantum well layer composed of undoped $In_{x3}Ga_{1-x3}P$ ($0<x3<1$) and the barrier layer composed of undoped $(Al_4Ga_{1-x4})_{1-x5}In_{x5}P$ ($0<x4\leq1$, $0<x5<1$) are layered. The foregoing In composition ratios x3 and x5 and the foregoing Al composition ratio x4 of the active layer 14 are determined in view of light emitting wavelength, light emitting wavelength interval, light density and the like. Examples of the active layer 14 include a laminated structure formed from 39.5 pairs of the quantum well layer composed of $Ga_{0.506}In_{0.494}P$ and the barrier layer composed of $(Al_{0.6}Ga_{0.4})_{0.506}In_{0.494}P$. In this case, the lattice matching ratio $\Delta a/a$ of the active layer 14 to the substrate 10 becomes, for example, 0.075%. The active layer 14 may have a structure other than the multiple quantum well structure such as a single quantum well structure and a bulk structure. The active layer 14 may contain other layer.

The p-type cladding layer 15 mainly contains AlGaInP. The bandgap thereof is larger than the bandgap of the active layer 14, and the refractive index thereof is smaller than the refractive index of the active layer 14. The p-type cladding layer 15 is formed from, for example, p-type $(Al_{x6}Ga_{1-x6})_{1-x7}In_{x7}P$ ($0<x6\leq1$, $0<x7<1$) as AlGaInP containing p-type impurity (p-type dopant). In the p-type cladding layer 15, the conduction band bottom thereof is higher than the conduction band bottom of the active layer 14, and is lower than the conduction band bottom of the n-type cladding layer 13. Examples of the p-type dopant include magnesium (Mg). Examples of the p-type cladding layer 15 include a p-type $(Al_{0.7}Ga_{0.3})_{0.506}In_{0.494}P$ layer having a thickness of 955 nm that is doped with Mg at the concentration of $1*10^{18}$ cm$^{-3}$. In this case, the lattice matching ratio Δa/a of the p-type cladding layer 15 to the substrate 10 becomes, for example, 0.075%. In the description, "to mainly contain" means that to mainly contain a component as one of main components of the material composing the layer, and does not deny a case that other main component is additionally contained or a case that a minor component having a smaller composition ratio than that of a main component is contained.

The intermediate layer 16 is intended to inhibit voltage drop between the p-type cladding layer 15 and the p-side contact layer 17. The intermediate layer 16 contains $Ga_{1-a}In_aP$ ($0.357 \leq a \leq 0.408$), and has a thickness of from 10 nm to 20 nm both inclusive. That is, the intermediate layer 16 has a single layer structure. Thereby, compared to a case that the intermediate layer 16 is not provided, a driving voltage is able to be kept low. The intermediate layer 16 may contain, for example, p-type dopant. The In composition ratio a of the intermediate layer 16 is from 0.357 to 0.408 both inclusive for the following reason. That is, in the case where the In composition ratio a is in such a range, deterioration of the device and absorption of the light emitted from the active layer 14 are inhibited. Specifically, in the case where the In composition ratio a is under 0.357, the absolute value of the lattice matching ratio in relation to the substrate 10 is increased, and lattice defect and crosshatch structure are more generated. In result, the device is easily deteriorated, and reliability is lowered. Meanwhile, in the case where the In composition ratio a exceeds 0.408, the bandgap of the intermediate layer 16 is decreased, the light emitted from the active layer 14 is easily absorbed, and light emitting output is decreased. Specially, the In composition ratio a of the intermediate layer 16 is preferably from 0.357 to 0.382 both inclusive, since thereby light emitting output is more improved. Further, the total thickness of the intermediate layer 16 is from 10 nm to 20 nm both inclusive for the following reason. That is, in the case where the total thickness of the intermediate layer 16 is within such a range, the driving voltage is able to be kept low, and absorption of the light emitted from the active layer 14 is inhibited. Specifically, in the case where the total thickness of the intermediate layer 16 is smaller than 10 nm, the driving voltage is easily increased, and the p-type dopant contained in the p-side contact layer 17 is easily flown into the active layer 14. Thus, driving voltage rise and deterioration of the device are generated, and reliability is decreased. Meanwhile, in the case where the total thickness of the intermediate layer 16 is larger than 20 nm, absorption of the emitted light is easily generated even if the In composition ratio a of $Ga_{1-a}In_aP$ is in the foregoing range. Further, since the critical film thickness of $Ga_{1-a}In_aP$ is 20 nm, lattice mismatching is generated. That is, in the case where in the intermediate layer 16, $Ga_{1-a}In_aP$ having the foregoing In composition ratio a is contained and the total thickness is a given level, the driving voltage is kept low, and the light emitting output and reliability are improved.

Examples of the intermediate layer 16 include a p-type $Ga_{0.680}In_{0.392}P$ layer having a thickness of 15 nm doped with Mg. In this case, the lattice matching ratio Δa/a of the intermediate layer 16 to the substrate 10 becomes, for example, −0.676%.

The p-side contact layer 17 mainly contains GaP (gallium phosphorus). The p-side contact layer 17 has an Mg diffusion inhibition layer 17A, a mutual diffusion inhibition spacer layer 17B, and a cap layer 17C sequentially from the intermediate layer 16 side.

The Mg diffusion inhibition layer 17A is intended to inhibit diffusion of Mg (p-type dopant) contained in the p-type cladding layer 15 and the intermediate layer 16 into the cap layer 17C. The Mg diffusion inhibition layer 17A contains Mg as p-type dopant at a higher concentration than that of Mg in the p-type cladding layer 15, and is formed from p-type GaP. Examples of the Mg diffusion inhibition layer 17A include a GaP layer having a thickness of 450 nm doped with Mg at a concentration of $1.2*10^{19}$ cm$^{-3}$.

The mutual diffusion inhibition spacer layer 17B is intended to inhibit diffusion of Mg from the Mg diffusion inhibition layer 17A side into the cap layer 17C, and diffusion of zinc (Zn) as p-type dopant contained in the cap layer 17C into the Mg diffusion inhibition layer 17A side. The mutual diffusion inhibition spacer layer 17B is formed from, for example, undoped GaP. Examples of the mutual diffusion inhibition spacer layer 17B include an undoped GaP layer having a thickness of 100 nm.

The cap layer 17C is formed from, for example, GaP doped with Zn as p-type dopant, and is electrically connected to the p-side electrode 21. Examples of the cap layer 17C include a GaP layer having a thickness of 50 nm doped with Zn at a concentration of $1.5*10^{19}$ cm$^{-3}$.

The p-side electrode 21 has a structure in which, for example, a titanium (Ti) layer, a platinum (Pt) layer, and a gold (Au) layer are layered in this order over a surface of the cap layer 17C of the p-side contact layer 17, and is electrically connected to the p-side contact layer 17. The n-side electrode 22 has a structure in which, for example, an alloy layer of gold (Au) and germanium (Ge), a nickel (Ni) layer, and a gold (Au) layer are layered in this order, and is electrically connected to the substrate 10.

The semiconductor light emitting device 1 is able to be manufactured, for example, as follows.

First, for example, on the substrate 10 composed of GaAs, the laminated structure 20 is formed by MOCVD (Metal Organic Chemical Vapor Deposition) method. At this time, as a raw material, for example, trimethyl aluminum (TMA), trimethyl gallium (TMG), trimethyl indium (TMIn), arsine (AsH$_3$), and phosphine (PH$_3$) are used. As a raw material of donor impurity, for example, hydrogen selenide (H$_2$Se) is used. As a raw material of acceptor impurity, for example, dispentadienyl magnesium or dimethyl zinc (DMZn) is used.

Specifically, over the substrate 10, the buffer layer 11, the n-side contact layer 12, the n-type cladding layer 13, the active layer 14, the p-type cladding layer 15, the intermediate layer 16, the Mg diffusion inhibition layer 17A, the mutual diffusion inhibition spacer layer 17B, and the cap layer 17C are layered in this order.

Finally, the p-side electrode 21 is formed on the cap layer 17C, and the n-side electrode 22 is formed on the rear face of the substrate 10 by, for example, vacuum evaporation method. Thereby, the semiconductor light emitting device 1 illustrated in FIG. 1 is completed.

In the semiconductor light emitting device 1, in the case where a given voltage is applied between the p-side electrode 21 and the n-side electrode 22, an electron from the n-side electrode 22 and an electron hole from the p-side electrode 21 are respectively injected into the active layer 14. The electron and the electron hole injected into the active layer 14 are recombined, and thereby photon is generated from the light emitting region. In result, emitted light is outputted outside.

In the semiconductor light emitting device of this embodiment, the intermediate layer 16 is provided between the p-type cladding layer 15 and the p-side contact layer 17. The intermediate layer 16 contains $Ga_{1-a}In_aP$ ($0.357 \leq a \leq 0.408$), and has a thickness of from 10 nm to 20 nm both inclusive. Thereby, voltage drop between the p-type cladding layer 15 and the p-side contact layer 17 is inhibited, and lattice matching in the intermediate layer 16 becomes favorable. Thus, lattice defect and crosshatch structure are hardly generated, and the device is hardly deteriorated. In addition, the bandgap of the intermediate layer 16 is sufficiently secured, and thus absorption of the light emitted from the active layer 14 is inhibited. Thus, according to the semiconductor light emitting device of this embodiment, the driving voltage is able to be kept low, and the light emitting output and reliability are able to be improved. In this case, in particular, in the case where the In composition ratio a of the intermediate layer 16 is from 0.357 to 0.382 both inclusive, the light emitting output is able to be more improved.

2. Modified Example

Example of Other Semiconductor Device

Figure 3:
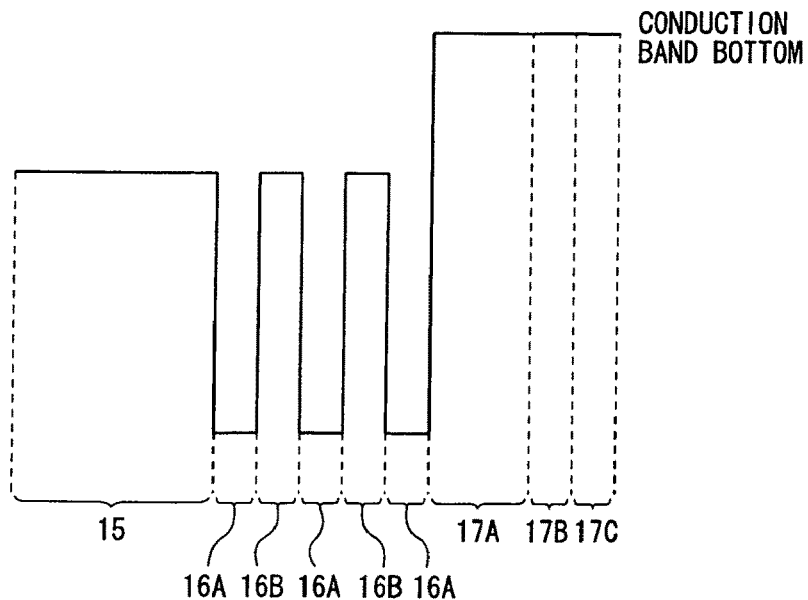
FIG. 3 is a schematic view illustrating energy band according to a modified example.

FIG. 3 schematically illustrates a level of conduction band bottom of energy band according to a modified example of the semiconductor light emitting device 1 illustrated in FIG. 1. A semiconductor light emitting device of this modified example has a structure similar to that of the semiconductor light emitting device 1 illustrated in FIG. 1 except for the structure of the intermediate layer 16.

In this case, the intermediate layer 16 also contains $Ga_{1-a}In_aP$ ($0.357 \leq a \leq 0.408$). However, the intermediate layer 16 has a superlattice structure in which a well layer 16A (first semiconductor layer) and a barrier layer 16B (second semiconductor layer) are alternately layered. The well layer 16A is formed from $Ga_{1-b}In_bP$ ($0.357 \leq b \leq 0.408$). The total thickness of the well layer 16A in the superlattice structure is from 10 nm to 20 nm both inclusive. The barrier layer 16B is formed from $(Al_cGa_{1-c})_{1-d}In_dP$ ($0.4 \leq c \leq 1$, $0 < d < 1$). Thereby, compared to the case that the intermediate layer 16 has the single layer structure containing $Ga_{1-a}In_aP$ ($0.357 \leq a \leq 0.408$), effective bandgap in the intermediate layer 16 becomes large. In this case, In composition ratio b of the well layer 16A is also preferably from 0.357 to 0.382 both inclusive, since thereby the light emitting output is able to be more improved.

The well layer 16A and the barrier layer 16B may contain p-type dopant. The thickness per one layer of the well layer 16A is preferably from 2 nm to 10 nm both inclusive. The thickness per one layer of the barrier layer 16B is preferably from 2 nm to 10 nm both inclusive. Examples of the intermediate layer 16 include a laminated structure formed from 2.5 pairs of the well layer 16A containing p-type $Ga_{0.680}In_{0.392}P$ having a thickness of 4 nm doped with Mg and the barrier layer 16B containing p-type $(Al_{0.7}Ga_{0.3})_{0.52}In_{0.48}P$ having a thickness of 4 nm doped with Mg. FIG. 3 illustrates a case that the intermediate layer 16 has 2.5 pairs of the well layer 16A and the barrier layer 16B. Further, the intermediate layer 16 may have other layer in addition to the well layer 16A and the barrier layer 16B.

In the semiconductor light emitting device according to this modified example, the intermediate layer 16 has the superlattice structure including the well layer 16A and the barrier layer 16B. The total thickness in the superlattice structure of the well layer 16A is from 10 nm to 20 nm both inclusive. Thereby, driving voltage rise and deterioration of the device are inhibited, and in addition, absorption of the light emitted from the active layer 14 is further inhibited. Thus, according to the semiconductor light emitting device of this modified example, the driving voltage is able to be kept low and the reliability is able to be improved. In particular, the light emitting output is able to be improved. Other action and other effect are similar to those of the foregoing first embodiment.

Second Embodiment

Figure 4A:
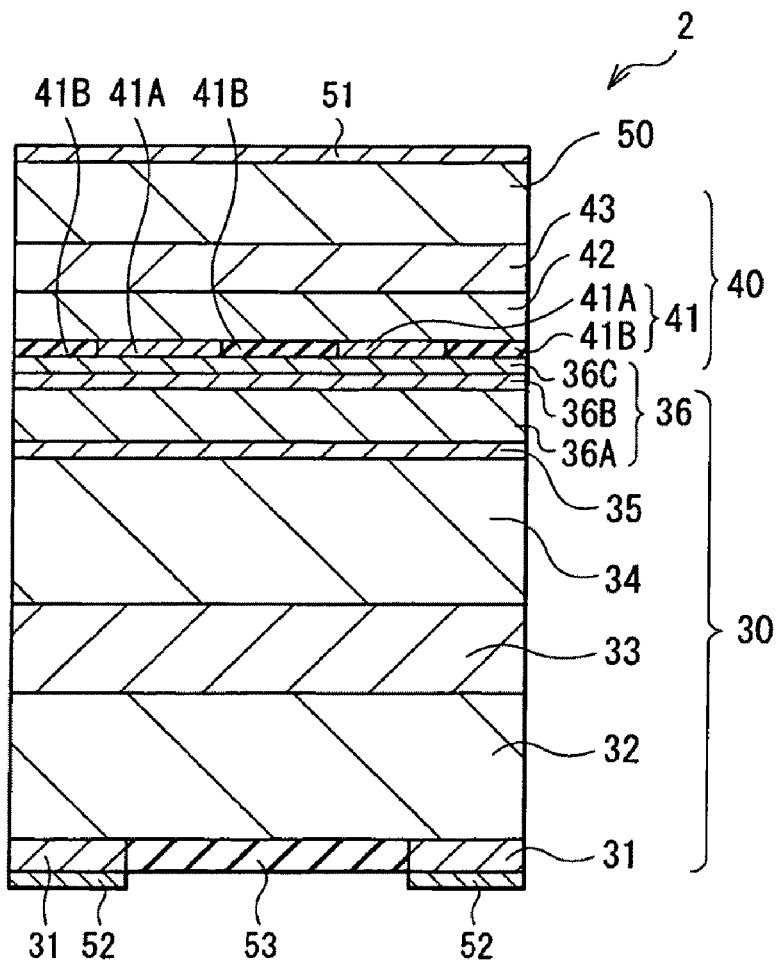
FIG. 4A is a schematic view illustrating a cross sectional structure of a semiconductor light emitting device according to a second embodiment of the invention.
Figure 4B:
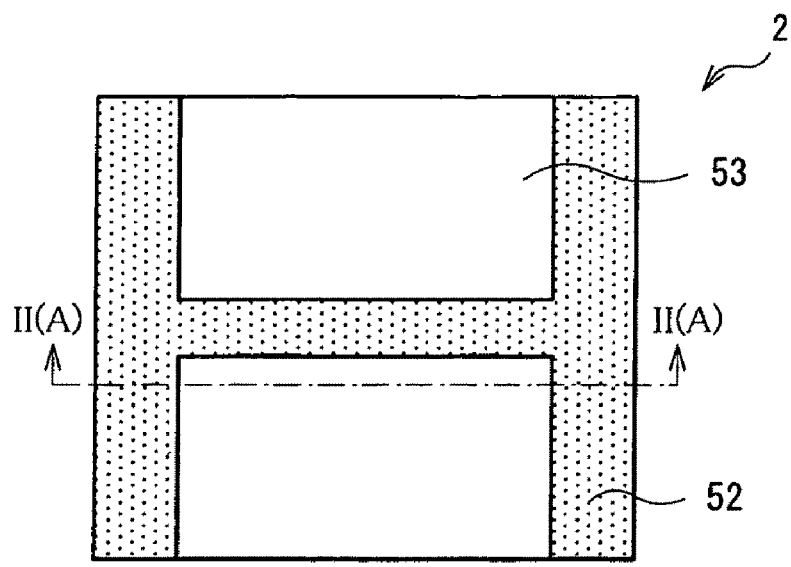
FIG. 4B is a schematic view illustrating a planar structure thereof.

FIGS. 4A and 4B illustrate a semiconductor light emitting device 2 according to a second embodiment of the invention. FIG. 4A illustrates a cross sectional structure taken along line II(A)-II(A) in FIG. 4B. FIG. 4B illustrates a planar structure viewed from an n-side electrode 52 side of FIG. 4A.

The semiconductor light emitting device 2 includes an n-side electrode 52, a protective layer 53, a laminated structure 30 including an active layer 33, a multilayer reflective film 40, a substrate 50, and a p-side electrode 51 in this order. In the semiconductor light emitting device 2, light emitted from the active layer 33 is reflected by the multilayer reflective film 40 and is extracted from the n-side electrode 52 side.

The laminated structure 30 has an n-side contact layer 31, an n-type cladding layer 32, the active layer 33, a p-type cladding layer 34, an intermediate layer 35, and a p-side contact layer 36 sequentially from the n-side electrode 52 side. The p-side contact layer 36 has an Mg diffusion inhibition layer 36A, a mutual diffusion inhibition spacer layer 36B, and a cap layer 36C sequentially from the intermediate layer 35 side. The laminated structure 30 is obtained as follows. A laminated structure 30 is formed as in the laminated structure 20 provided on the substrate 10 in the foregoing semiconductor light emitting device 1. After that, the substrate 10, the buffer layer 11 of the laminated structure 20, and part of the n-side contact layer 12 are removed from the laminated structure. That is, the n-side contact layer 31, the n-type cladding layer 32, the active layer 33, the p-type cladding layer 34, the intermediate layer 35, and the p-side contact layer 36 respectively have each structure similar to that of the n-side contact layer 12, the n-type cladding layer 13, the active layer 14, the p-type cladding layer 15, the intermediate layer 16, and the p-side contact layer 17 except for the planar shape of the n-side contact layer 31. Thus, each band lineup of each layer composing the laminated structure 30 is similar to that of FIG. 2 or FIG. 3.

The n-side contact layer 31 includes two separate rectangular regions which are provided on one face of the n-type cladding layer 32. On a region of the n-type cladding layer 32 between the two regions of the n-side contact layer 31, the protective layer 53 composed of, for example, silicon nitride is provided.

The multilayer reflective film 40 is intended to reflect light emitted from the active layer 33 to the n-side electrode 52. The multilayer reflective film 40 has a contact section 41, a first multilayer reflective film 42, and a second multilayer reflective film 43 sequentially from the laminated structure 30 side. The multilayer reflective film 40 is formed as follows. The contact section 41 and the first multilayer reflective film 42 are formed on the p-side contact layer 36 of the laminated structure 30, and the second multilayer reflective film 43 is formed on the substrate 50. After that, the first multilayer reflective film 42 and the second multilayer reflective film 43 are jointed, and accordingly the multilayer reflective film 40 is formed.

The contact section 41 has a pair of rectangular conductive sections 41A provided in parallel with each other toward one direction on the surface of the p-side contact layer 36 of the laminated structure 30 and an insulating section 41B provided between and outside the pair of conductive sections 41A on the surface of the p-side contact layer 36. The conductive section 41A has a structure in which, for example, a titanium (Ti) layer having a thickness of 10 nm and an alloy (AuZn) layer of gold and zinc having a thickness of 100 nm are layered sequentially from the p-side contact layer 36 side.

The insulating section 41B is composed of, for example, silicon oxide having a thickness of 110 nm.

In the first multilayer reflective film 42 and the second multilayer reflective film 43, a plurality of layers composed of, for example, a metal are layered. The first multilayer reflective film 42 has a structure in which, for example, an Al layer having a thickness of 10 nm, an Au layer having a thickness of 400 nm, a Ti layer having a thickness of 50 nm, a Pt layer having a thickness of 100 nm, and an Au layer having a thickness of 500 nm are layered sequentially from the contact section 41 side. The second multilayer reflective film has a structure in which, for example, an Au layer having a thickness of 500 nm, a Pt layer having a thickness of 100 nm, a Ti layer having a thickness of 50 nm, an Au layer having a thickness of 400 nm, an Ni layer having a thickness of 45 nm, and an AuGe layer having a thickness of 160 nm are layered sequentially from the first multilayer reflective film 42 side.

The substrate 50 is used as a substrate for forming the second multilayer reflective film 43, and is, for example, a GaAs substrate or the like.

The p-side electrode 51 has a structure in which, for example, a Ti layer, a Pt layer, and an Au layer are layered in this order over the surface of the substrate 50, and is electrically connected to the substrate 50. The n-side electrode 52 is provided on the surface of the n-side contact layer 31 and part of the surface of the protective layer 53. The n-side electrode 52 has a structure in which, for example, an AuGe layer, an Ni layer, and an Au layer are layered in this order, and is electrically connected to the n-side contact layer 31.

The semiconductor light emitting device 2 is able to be manufactured, for example, as follows.

First, for example, on a substrate composed of GaAs, a laminated structure is formed as in the case of forming the foregoing laminated structure 20. After that, by using etching method, the substrate composed of GaAs and a buffer layer are removed and part of an n-side contact layer is removed. Thereby, the laminated structure 30 is formed.

Subsequently, the conductive section 41A and the insulating section 41B are patterned on the cap layer 36C of the laminated structure 30, and thereby the contact section 41 is formed. After that, the first multilayer reflective film 42 is formed on the contact section 41 by vacuum evaporation method. Meanwhile, the second multilayer reflective film 43 is formed on one face of the substrate 50 composed of GaAs, and the p-side electrode 51 is formed on the other face thereof. Next, the first multilayer reflective film 42 and the second multilayer reflective film 43 formed on the substrate 50 are positioned oppositely and connected with each other.

Finally, the protective layer 53 is formed on the surface of the n-type cladding layer 32 between the n-side contact layers 31 of the laminated structure 30, and the n-side electrode 52 is formed on the surface of the n-side contact layer 31 and on the partial surface of the protective layer 53 by, for example, vacuum evaporation method. Accordingly, the semiconductor light emitting device 2 illustrated in FIG. 4 is completed.

In the semiconductor light emitting device 2, in the case where a given voltage is applied between the p-side electrode 51 and the n-side electrode 52, an electron from the n-side electrode 52 and an electron hole from the p-side electrode 51 are respectively injected into the active layer 33. The electron and the electron hole injected into the active layer 33 are recombined, and thereby photon is generated from the light emitting region. In result, emitted light is generated, and is outputted by the multilayer reflective film 40 from the n-side electrode 52 side.

In the semiconductor light emitting device 2 of this embodiment, the intermediate layer 35 is also provided between the p-type cladding layer 34 and the p-side contact layer 36. The intermediate layer 35 has a structure similar to that of the intermediate layer 16 in the foregoing first embodiment or the foregoing modified example. Thus, the semiconductor light emitting device 2 actions as in the semiconductor light emitting device 1 of the first embodiment or the semiconductor light emitting device of the modified example. That is, voltage drop is kept low, and the light emitting output and reliability are able to be improved.

EXAMPLES

A description will be given in detail of specific examples of the invention.

Examples 1 to 5

The semiconductor light emitting device 2 illustrated in FIGS. 4A and 4B was fabricated by the following procedure.

First, the laminated structure 30 was formed by MOCVD method. At this time, as a raw material, trimethyl aluminum (TMA), trimethyl gallium (TMG), trimethyl indium (TMIn), arsine ($AsH_3$), and phosphine ($PH_3$) were used. As a raw material of donor impurity, hydrogen selenide ($H_2Se$) was used. As a raw material of acceptor impurity, dispentadienyl magnesium or dimethyl zinc (DMZn) was used.

Specifically, first, over a GaAs substrate, a buffer layer composed of n-type GaAs (thickness: 200 nm, Se doping concentration: $5*10^{18}$ $cm^{-3}$), an n-side contact layer composed of n-type GaAs (thickness: 100 nm, Se doping concentration: $2*10^{18}$ $cm^{-3}$), and the n-type cladding layer 32 composed of n-type $Al_{0.506}In_{0.494}P$ (thickness: 900 nm, Se doping concentration: $5*10^{18}$ $cm^{-3}$) were layered in this order. Subsequently, on the n-type cladding layer 32, the active layer 33 in which 39.5 pairs of the quantum well layer (thickness: 5 nm) composed of $Ga_{0.506}In_{0.494}P$ and the barrier layer (thickness: 7.1 nm) composed of $(Al_{0.6}Ga_{0.4})_{0.506}In_{0.494}P$ were layered was formed. Subsequently, on the active layer 33, the p-type cladding layer 34 composed of p-type $(Al_{0.7}Ga_{0.3})_{0.506}In_{0.494}P$ (thickness: 955 nm, Mg doping concentration: $1*10^{18}$ $cm^{-3}$) and the intermediate layer 35 composed of Mg-doped p-type $Ga_{1-a}In_aP$ having a thickness of 20 nm were layered in this order. At this time, in Examples 1 to 5, each In composition ratio a in the intermediate layer 35 was as illustrated in Table 1. On the intermediate layer 35, the Mg diffusion inhibition layer 36A composed of p-type GaP (thickness: 450 nm, Mg doping concentration: $1.2*10^{19}$ $cm^{-3}$), the mutual diffusion inhibition spacer layer 36B composed of undoped GaP (thickness: 100 nm), and the cap layer 36C composed of p-type GaP (thickness: 50 nm, Zn doping concentration: $1.5*10^{19}$ $cm^{-3}$) were layered in this order.

Figure 5A:
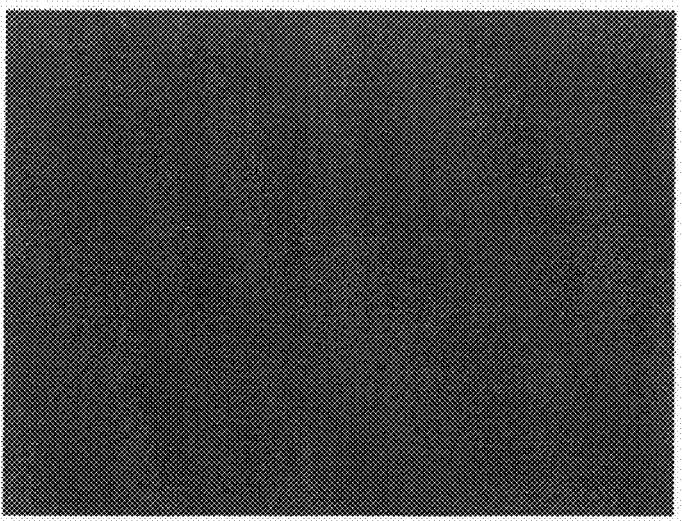
FIG. 5A is an optical microscope photograph illustrating a surface morphology of a cap layer in Example 1.
Figure 5B:
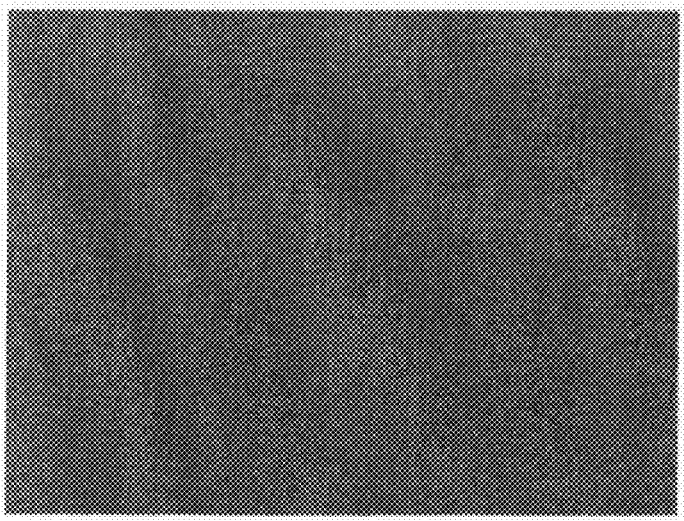
FIG. 5B is an optical microscope photograph illustrating a surface morphology of a cap layer in Example 5.

At this time, the surface morphology of the cap layer 36C was observed by an optical microscope (Normarski differential interferometer). As a representative of Examples 1 to 5, the results of Examples 1 and 5 are illustrated in FIGS. 5A and 5B. FIG. 5A is the surface morphology photograph in Example 1, and FIG. 5B is the surface morphology photograph in Example 5.

After that, by using photography method and etching method, the substrate composed of GaAs and the buffer layer were removed and part of the n-side contact layer was removed. Thereby, the laminated structure 30 was formed.

Subsequently, on the cap layer 36C of the laminated structure 30, a Ti layer (thickness: 10 nm) and an alloy (AuZn) layer of gold and zinc (thickness: 100 nm) were layered in this order. After that, a mask pattern was formed on the AuZn layer by photolithography method. The conductive section 41A was patterned by using the mask pattern. After that, the insulating section 41B composed of silicon oxide was formed by evaporation method. Subsequently, on the contact section 41 by vacuum evaporation method, an Al layer having a thickness of 10 nm, an Au layer having a thickness of 400 nm, a Ti layer having a thickness of 50 nm, a Pt layer having a thickness of 100 nm, and an Au layer having a thickness of 500 nm were layered in this order. Thereby, the first multilayer reflecting film 42 was formed.

Meanwhile, on one face of the substrate 50 composed of n-type GaAs, an AuGe layer (thickness 160 nm), an Ni layer (thickness 45 nm), an Au layer (thickness 400 nm), a Ti layer (thickness 50 nm), a Pt layer (thickness 100 nm), and an Au layer (thickness 500 nm) were layered in this order, are thereby the second multilayer reflective film 43 was formed, and the p-side electrode 51 was formed on the opposite face of the substrate 50. Next, the first multilayer reflective film 42 and the second multilayer reflective film 43 formed on the substrate 50 were oppositely arranged and were connected with each other.

Finally, the protective layer 53 composed of silicon nitride (thickness 85 nm) was formed on the surface of the n-type cladding layer 32 between the n-side contact layers 31 of the laminated structure 30, and the n-side electrode 52 was formed on the surface of the n-side contact layer 31 and on the partial surface of the protective layer 53 by vacuum evaporation method. Accordingly, the semiconductor light emitting device 2 illustrated in FIG. 4 was completed.

Example 6

A procedure similar to that of Examples 1 to 5 was performed, except that the In composition ratio a was 0.340 in forming the intermediate layer 35. For Example 6, the surface morphology of the cap layer 36C was observed as in Examples 1 to 5. The result illustrated in FIG. 5C was obtained.

For the semiconductor light emitting devices of Examples 1 to 6, a current of 40 mA was applied to measure a driving voltage (mV) and light output (mW). The result illustrated in Table 1 and FIG. 6 was obtained. Further, the lattice matching ratio to the GaAs substrate used as a crystal growth-use substrate of the laminated structure 30 in the intermediate layer 35 of each example was calculated. The result is also illustrated in Table 1 together.

TABLE 1

| | In composition ratio a of intermediate layer (p-type $Ga_{1-a}In_aP$ layer) | Lattice matching ratio $\Delta a/a$ to the GaAs substrate (%) | Driving voltage (mV) | Light output (mW) |
|---|---|---|---|---|
| Example 1 | 0.357 | -0.938 | 7.10 | 0.284 |
| Example 2 | 0.369 | -0.849 | 7.10 | 0.284 |
| Example 3 | 0.376 | -0.797 | 7.05 | 0.282 |
| Example 4 | 0.382 | -0.753 | 7.05 | 0.282 |
| Example 5 | 0.408 | -0.561 | 6.50 | 0.260 |
| Example 6 | 0.340 | -1.06 | 7.08 | 0.283 |

Figure 5C:
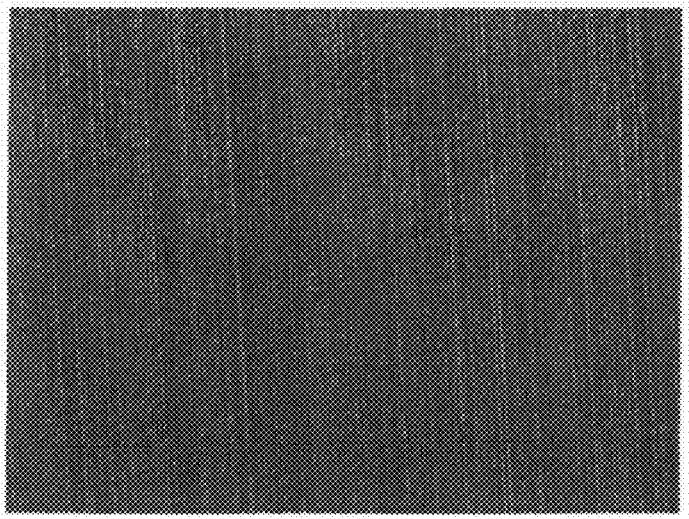
FIG. 5C is an optical microscope photograph illustrating a surface morphology of a cap layer in Example 6.

As illustrated in FIG. 5, in Examples 1 and 5 in which the In composition ratio a of the intermediate layer 35 was 0.357 or 0.408, the crosshatch structure (streaks in FIG. 5C) observed in Example 6 in which the In composition ratio a was 0.340 was hardly observed. In particular, in Example 5, concavity and convexity of the surface was smaller than that of Example 1. These results correspond to the results of lattice matching ratio to the GaAs substrate as illustrated in Table 1. As the In composition ratio of the intermediate layer 35 was increased, the absolute value of the lattice matching ratio was decreased. From these results, it is found that in the case where the In composition ratio a of p-type $Ga_{1-a}In_aP$ contained in the intermediate layer 35 was from 0.357 to 0.408 both inclusive, lattice mismatching such as crosshatch structure was hardly generated, and thus driving voltage rise and deterioration of the device were inhibited.

Figure 6:
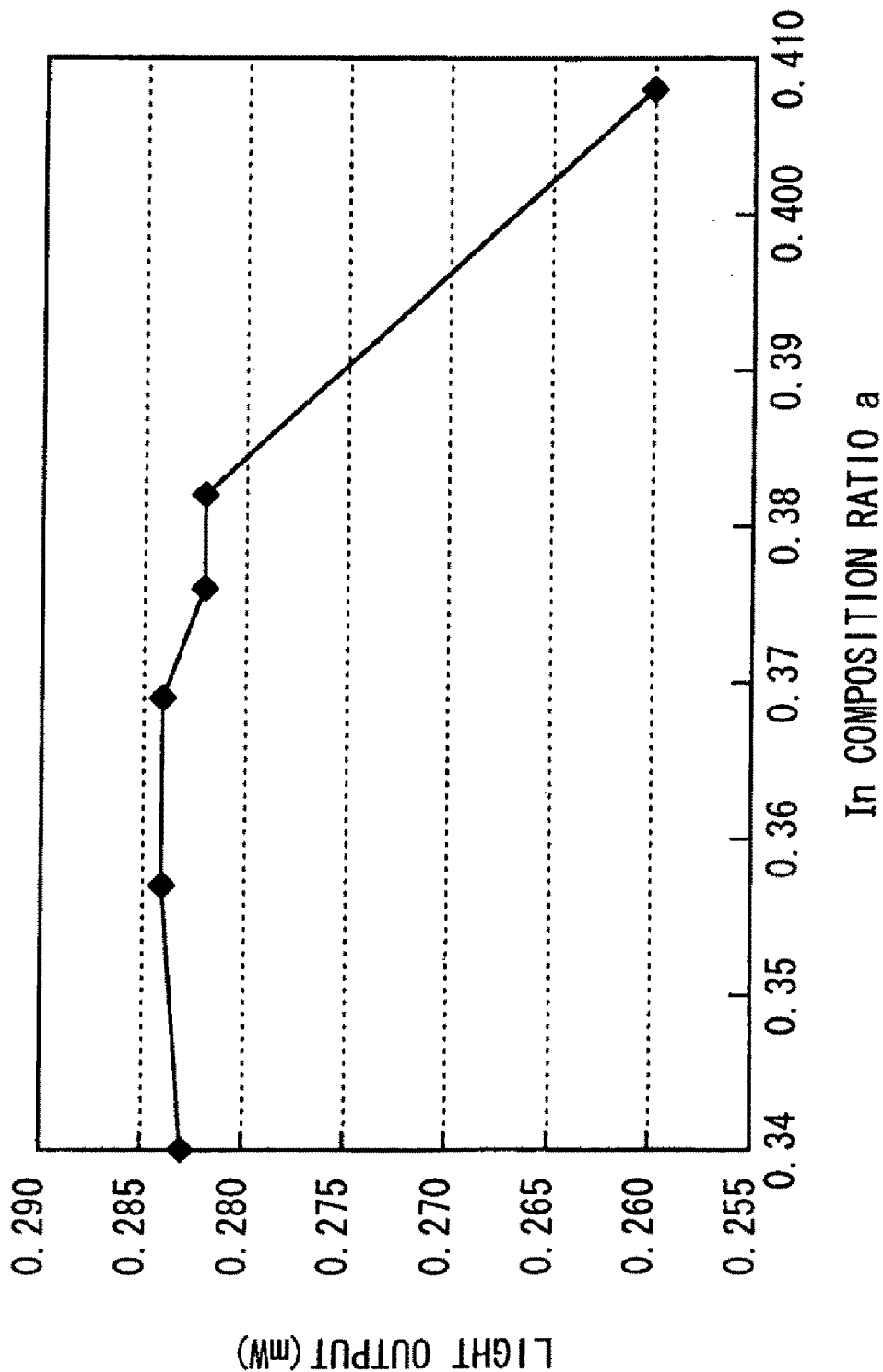
FIG. 6 is a characteristics view illustrating a relation between an In composition ratio and light output in an intermediate layer in the examples.

As illustrated in Table 1 and FIG. 6, there was a tendency that as the In composition ratio a of the intermediate layer 35 was increased, the light output was decreased. However, in the case where the In composition ratio a was 0.408 or less, the result was favorable, that is, the driving voltage was kept low and the light output was 0.25 mW or more. In this case, in particular, in the case where the In composition ratio a was 0.382 or less, light output of 0.280 mW or more was obtained. The result showed that in the case where the In composition ratio a of p-type $Ga_{1-a}In_aP$ contained in the intermediate layer 35 was from 0.357 to 0.408 both inclusive, light absorption by the intermediate layer 35 was sufficiently inhibited.

In this case, the result in the case where the intermediate layer 35 having a thickness of 20 nm was provided was shown. However, in the case where the thickness was 10 nm or more and under 20 nm, similar result was obtained.

From the result, in the semiconductor light emitting device 2, the following was confirmed. That is, in the case where the intermediate layer 35 that contained $Ga_{1-a}In_aP$ ($0.357 \leq a \leq 0.408$) and had a thickness of from 10 nm to 20 nm both inclusive was included between the p-type cladding layer 34 and the p-side contact layer 36, voltage drop between the p-type cladding layer 34 and the p-side contact layer 36 was inhibited, and lattice matching in the intermediate layer 35 became favorable. Thus, lattice defect and crosshatch structure were hardly generated, and deterioration of the device was inhibited. In addition, in the case where the In composition ratio a was in the foregoing range, the bandgap of the intermediate layer 35 was sufficiently secured, and thus absorption of light emitted from the active layer 33 was inhibited. Thus, the driving voltage was able to be kept low, and light emitting output and the reliability were able to be improved.

In the examples, the result of the case that the intermediate layer between the p-type cladding layer containing AlGaInP and the p-side contact layer containing GaP is a single layer structure has been shown, but a result of a case that the intermediate layer has a superlattice structure has not been shown. However, as long as the intermediate layer has a superlattice structure including a well layer containing $Ga_{1-b}In_bP$ ($0.357 \leq b \leq 0.408$) and a barrier layer containing $(Al_cGa_{1-c})_{1-d}In_dP$ ($0.4 \leq c \leq 1$, $0 < d < 1$) and the total thickness of the well layer in the superlattice structure is from 10 nm to 20 nm both inclusive, the same function as that of the intermediate layer having the foregoing single layer structure is obtained. Thus, it is evident that in the case where the intermediate layer having the super lattice structure is provided, a result similar to that of the case of providing the intermediate layer having the single layer structure is obtained.

Descriptions have been hereinbefore given of the invention with reference to the embodiments, the modified example thereof, and the examples. However, the invention is not limited to the foregoing embodiments and the like, and various modifications may be made. For example, the semiconductor light emitting device of the invention is able to be used as a laser diode.

Further, in the foregoing embodiments and the like, the description has been given of the case that the laminated structure included in the semiconductor light emitting device is a structure in which the buffer layer and the liker are layered. However, such lamination does not deny a possibility that the laminated structure includes a layer other than the buffer layer and the like. That is, in addition to the buffer layer and the like, the laminated structure may include other layer. For example, a current diffusion layer containing n-type AlGaInP having a higher Al composition ratio than that of AlGaInP contained in the p-type cladding layer may be provided between the n-side contact layer and the n-type cladding layer. Further, for example, a cladding layer not containing p-type or n-type dopant may be provided between the active layer and the n-type cladding layer or the p-type cladding layer. The same is applied to a case having a structure in which, for example, an active layer and the like are layered other than the laminated structure.

Further, in the foregoing embodiments and the like, for the thickness of the intermediate layer, the In composition ratio or the Al composition ratio of the material contained in the intermediate layer or the like, appropriate numerical value ranges have been described. However, such descriptions do not totally deny possibility that the thickness of the intermediate layer and the like may be out of the foregoing ranges. That is, the foregoing appropriate ranges are ranges particularly favorable for obtaining effect of the invention. Thus, as long as the effect of the invention is able to be obtained, the thickness of the intermediate layer and the like may be slightly out of the foregoing ranges.

The present application contains subject matter related to that disclosed in Japanese Priority Patent Application JP 2009-184673 filed in the Japan Patent Office on Aug. 7, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor light emitting device comprising:
   an n-type cladding layer;
   an active layer;
   a p-type cladding layer containing AlGaInP;
   an intermediate layer; and
   a contact layer containing GaP in this order, wherein the intermediate layer contains $Ga_{1-a}In_aP$ ($0.357 \leq a \leq 0.408$), and has a thickness of from 10 nm to 20 nm both inclusive.

2. The semiconductor light emitting device according to claim 1, wherein an In composition ratio a of $Ga_{1-a}In_aP$ contained in the intermediate layer is from 0.357 to 0.382 both inclusive.

3. A semiconductor light emitting device comprising:
   an n-type cladding layer;
   an active layer;
   a p-type cladding layer containing AlGaInP;
   an intermediate layer; and
   a contact layer containing GaP in this order, wherein the intermediate layer has a superlattice structure including a first semiconductor layer containing $Ga_{1-b}In_bP$ ($0.357 \leq b \leq 0.408$) and a second semiconductor layer containing $(Al_cGa_{1-c})_{1-d}In_dP$ ($0.4 \leq c \leq 1$, $0 < d < 1$), and a total thickness of the first semiconductor layer in the superlattice structure is from 10 nm to 20 nm both inclusive.

4. The semiconductor light emitting device according to claim 3, wherein an In composition ratio b of $Ga_{1-b}In_bP$ contained in the first semiconductor layer is from 0.357 to 0.382 both inclusive.

* * * * *